(12) United States Patent
Miyoshi et al.

(10) Patent No.: US 9,954,138 B2
(45) Date of Patent: Apr. 24, 2018

(54) LIGHT EMITTING ELEMENT

(71) Applicant: USHIO DENKI KABUSHIKI KAISHA, Tokyo (JP)

(72) Inventors: Kohei Miyoshi, Himeji (JP); Masashi Tsukihara, Himeji (JP)

(73) Assignee: USHIO DENKI KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/322,602

(22) PCT Filed: Jun. 29, 2015

(86) PCT No.: PCT/JP2015/068609
§ 371 (c)(1),
(2) Date: Dec. 28, 2016

(87) PCT Pub. No.: WO2016/002684
PCT Pub. Date: Jan. 7, 2016

(65) Prior Publication Data
US 2017/0155013 A1    Jun. 1, 2017

(30) Foreign Application Priority Data
Jul. 2, 2014 (JP) ................ 2014-136930

(51) Int. Cl.
*H01L 33/18* (2010.01)
*H01L 33/16* (2010.01)
(Continued)

(52) U.S. Cl.
CPC ...... *H01L 33/0025* (2013.01); *H01L 21/0242* (2013.01); *H01L 21/0254* (2013.01);
(Continued)

(58) Field of Classification Search
CPC .... H01L 33/0025; H01L 33/00–33/075; H01L 21/0242; H01L 21/02458;
(Continued)

(56) References Cited

U.S. PATENT DOCUMENTS

| 5,777,350 A | 7/1998 | Nakamura et al. |
| 2001/0030318 A1 | 10/2001 | Nakamura et al. |

(Continued)

FOREIGN PATENT DOCUMENTS

| JP | H10-93138 A | 4/1998 | |
| JP | H10270756 | * 9/1998 | ............. H01L 33/06 |

(Continued)

OTHER PUBLICATIONS

Zhou et al. AlGaN/GaN multiple quantum wells grown on facet-controlled epitaxial lateral overgrown GaN/sapphire templates. Journal of Physics: Condenced Matter 19, pp. 1-10.*

(Continued)

*Primary Examiner* — Galina Yushina
(74) *Attorney, Agent, or Firm* — Studebaker & Brackett PC

(57) ABSTRACT

An LED element is provided with: a first semiconductor layer formed of an n-type nitride semiconductor; a second semiconductor layer formed on top of the first semiconductor layer and formed of quaternary mixed crystals of $Al_{x1}Ga_{y1}In_{z1}N$ ($0<x1<1$, $0<y1<1$, $0<z1<1$ and $x1+y1+z1=1$); a heterostructure formed on top of the second semiconductor layer and constituted of a laminate structure of a third semiconductor layer formed of $In_{x2}Ga_{1-x2}N$ ($0<x2<1$) having a film thickness of greater than or equal to 10 nm, and a fourth semiconductor layer formed of $Al_{x3}Ga_{y3}In_{z3}N$ ($0<x3<1$, $0<y3<1$, $0\leq z3<1$ and $x3+y3+z3=1$); and a fifth semiconductor layer formed on top of the heterostructure and formed of a p-type nitride semiconductor.

19 Claims, 9 Drawing Sheets (a)

(b)

(51) Int. Cl.
  *H01L 33/00* (2010.01)
  *H01L 33/32* (2010.01)
  *H01L 21/02* (2006.01)

(52) U.S. Cl.
  CPC .... *H01L 21/0262* (2013.01); *H01L 21/02458* (2013.01); *H01L 21/02505* (2013.01); *H01L 21/02576* (2013.01); *H01L 21/02579* (2013.01); *H01L 33/16* (2013.01); *H01L 33/32* (2013.01); *H01L 33/0075* (2013.01); *H01L 33/18* (2013.01)

(58) Field of Classification Search
  CPC ........... H01L 21/02505; H01L 21/0254; H01L 21/02567; H01L 21/0262
  See application file for complete search history.

(56) References Cited

U.S. PATENT DOCUMENTS

| | | | |
|---|---|---|---|
| 2002/0167019 A1 | 11/2002 | Nakamura et al. | |
| 2006/0175600 A1* | 8/2006 | Sato | B82Y 20/00 257/14 |
| 2009/0212277 A1 | 8/2009 | Akita et al. | |
| 2013/0049064 A1* | 2/2013 | Daigo | C23C 16/4586 257/103 |
| 2013/0146928 A1* | 6/2013 | Inoue | H01L 33/20 257/98 |
| 2013/0214288 A1* | 8/2013 | Yokogawa | H01L 33/32 257/76 |
| 2014/0103391 A1 | 4/2014 | Haruta et al. | |

FOREIGN PATENT DOCUMENTS

| | | |
|---|---|---|
| JP | H10-270756 A | 10/1998 |
| JP | 2005-209925 A | 8/2005 |
| JP | 2009-200337 A | 9/2009 |
| JP | 2012-231122 A | 11/2012 |

OTHER PUBLICATIONS

Yang et al. InGaN/GaN multiple quantum wells on selectively grown GaN nucrifacets and the applications for phosphor-free white light-emitting diodes. Reviews in Physics 1 (2016, pp. 101-119).*
International Search Report issued in PCT/JP2015/068609; dated Sep. 8, 2015.
An Office Action "Notification of Reasons for Refusal" issued by the Japanese Patent Office dated Mar. 15, 2016, in connection with Japanese Patent Application No. 2014-136930.
A "Decision to Grant a Patent" issued by the Japanese Patent Office dated Jul. 1, 2016, in connection with Japanese Patent Application No. 2014-136930.
Notification of Transmittal of Translation of the International Preliminary Report on Patentability and Translation of Written Opinion of the International Searching Authority; PCT/JP2015/068609 dated Jan. 12, 2017.

* cited by examiner

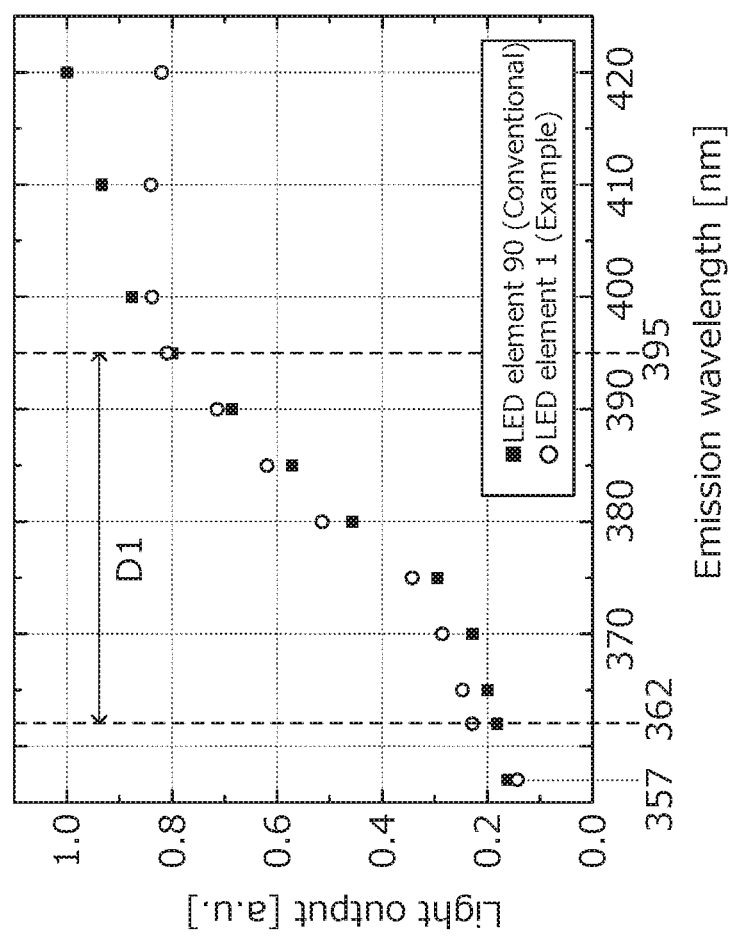

| LED element | Yield [%] |
|---|---|
| Conventional example | 65 |
| Reference example | 75 |
| Example 1 | 85 |
| Example 2 | 83 |

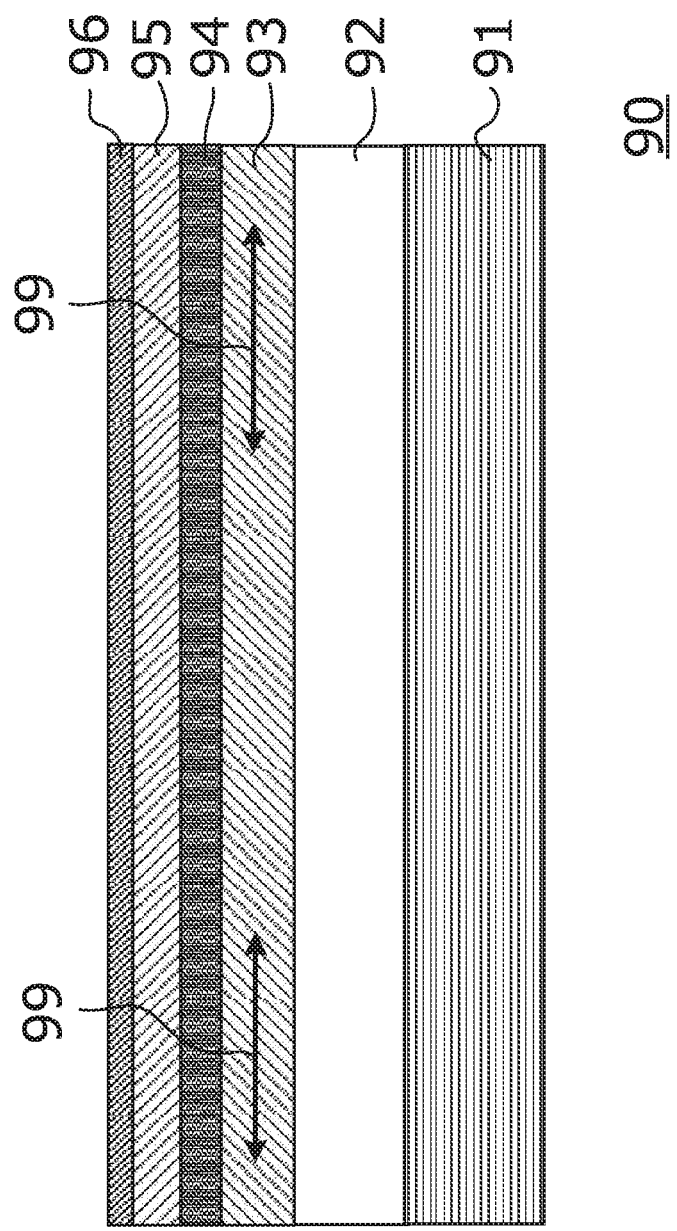
Fig. 10 --Prior Art--

LIGHT EMITTING ELEMENT

TECHNICAL FIELD

The present invention relates to an LED element, and more particularly to an LED element formed of a nitride semiconductor.

BACKGROUND ART

Conventionally, as an LED element formed of a nitride semiconductor, a semiconductor layer structure is formed on a sapphire substrate (laminated semiconductor substrate) as typified by a blue LED. Such a technique is disclosed, for example, in the following Patent Document 1 and Patent Document 2.

Patent Document 1 discloses an LED having such a structure that on top of a sapphire substrate, an n-type contact layer formed of n-GaN, an n-type cladding layer formed of n-AlGaN, an active layer formed of n-InGaN, a p-type cladding layer formed of p-AlGaN, and a p-type contact layer formed of p-GaN are laminated in sequence. The active layer is realized by a single quantum well structure or a multi-quantum well structure.

Between the sapphire substrate and the n-type contact layer, a buffer layer formed of GaN, AlGaN or MN is formed. The n-InGaN that forms the active layer is doped with a donor impurity such as Si or Ge and/or an acceptor impurity such as Zn or Mg.

Patent Document 2 discloses the feature of growing, on AlN of which plane direction is aligned to the c-axis direction, a GaN layer having a lattice constant larger than that of the AlN and having a plane direction aligned to the c-axis direction, and forming, on the GaN layer, an n-AlGaN layer having a lattice constant smaller than that of the GaN, an active layer having a multi-quantum well structure, and a p-AlGaN layer in this sequence in a laminated semiconductor substrate that forms an LED.

PRIOR ART DOCUMENT

Patent Documents

Patent Document 1: JP-A-10-93138
Patent Document 2: JP-A-2005-209925

SUMMARY OF THE INVENTION

Problems to be Solved by the Invention

A nitride semiconductor such as GaN or AlGaN has a wurtzite crystal structure (hexagonal crystal structure). Regarding faces of the wurtzite crystal structure, the crystal face and the orientation are expressed by using fundamental vectors represented by a1, a2, a3 and c according to the 4 exponential notation (hexagonal crystal index). The fundamental vector c extends in the direction of [0001], and this direction is called "c-axis". The face perpendicular to the c-axis is called "c-plane" or "(0001) plane".

Conventionally, in production of a semiconductor light-emitting element using a nitride semiconductor, a substrate having a c-plane substrate as the main face is used as a substrate on which nitride semiconductor crystals are grown. Actually, a GaN layer is grown on this substrate at a low temperature, and further a nitride semiconductor layer is grown on top of the GaN layer.

FIG. 10 is a schematic section view showing a structure of a conventional LED element 90. In the following drawing, the actual dimensional ratio and the dimensional ratio in the drawing do not necessarily coincide with each other.

The LED element 90 has an undoped layer 92 formed of GaN having a film thickness of 3 μm on top of a growth substrate 91 formed, for example, of sapphire, and an n-type cladding layer 93 formed of n-AlGaN having a film thickness of 1.5 μm on top of the undoped layer 92. Further, the LED element 90 has on top of the n-type cladding layer 93, an active layer 94 that constitutes a MQW in which a light emitting layer formed of InGaN having a film thickness of 2 nm and a barrier layer formed of AlGaN having a film thickness of 5 nm are alternately laminated periodically (Multi-quantum Well).

Further, the LED element 90 has a p-type cladding layer 95 constituted, for example, of a p-AlGaN layer on top of the active layer 94, and has a p-type contact layer 96 constituted of a $p^+$-GaN layer on top of the p-type cladding layer 95.

Here, there is a difference in the lattice constant between GaN and AlN. To be more specific, while the lattice constant of GaN is 0.3189 nm in the a-axis direction, and is 0.5185 nm in the c-axis direction, the lattice constant of MN is 0.3112 nm in the a-axis direction, and is 0.4982 nm in the c-axis direction. Therefore, when the n-type cladding layer 93 formed of AlGaN having a lattice constant smaller than that of GaN is grown on top of the undoped layer 92 formed of GaN, a tensile stress 99 caused by the lattice mismatch arises in the n-type cladding layer 93. The arrow directed by the tensile stress 99 indicates the direction of the stress. The tensile stress 99 increases as the film thickness of the n-type cladding layer 93 increases, and when the tensile stress 99 exceeds a certain threshold, surface roughness, cracking, and misfit dislocation in association with a crystal defect occur to lead the deterioration in emission efficiency.

On the other hand, in the case of the n-type cladding layer 93 having a too small film thickness, when a voltage is applied between the power feeding terminal formed on the upper face of the p-type contact layer 96 and the n-type cladding layer 93, most of the current flows in the direction perpendicular to the substrate plane from the power feeding terminal. In other words, the current flows only in a partial region within the active layer 94, and the light emitting region is reduced, with the result that the emission efficiency is decreased. Further, since the current flows in a part of the active layer 94, local current crowding occurs, and unevenness of the carrier occurs in the active layer 94, and thus high light emission intensity cannot be obtained.

In light of the above problem, it is an object of the present invention to realize an LED element with improved emission efficiency by ensuring current spreading in the horizontal direction within the active layer without leasing a problem caused lattice mismatch in an n-type semiconductor layer adjacent to the active layer.

Means for Solving the Problem

An LED element according to the present invention has:
a first semiconductor layer formed of an n-type nitride semiconductor;
a second semiconductor layer formed on top of the first semiconductor layer, and formed of quaternary mixed crystals of $Al_{x1}Ga_{y1}In_{z1}N$ ($0<x1<1$, $0<y1<1$, $0<z1<1$, $x1+y1+z1=1$);
a heterostructure formed on top of the second semiconductor layer, and constituted of a laminate structure of a third semiconductor layer formed of $In_{x2}Ga_{1-x2}N$ ($0<x2<1$) having a film thickness of greater than or equal to 10 nm, and a fourth semiconductor layer formed of $Al_{x3}Ga_{y3}In_{z3}N$ ($0<x3<1$, $0<y3<1$, $0≤z3<1$, $x3+y3+z3=1$); and a fifth semiconductor layer formed on top of the heterostructure and formed of a p-type nitride semiconductor.

By the heterojunction between the third semiconductor layer formed of $In_{x2}Ga_{1-x2}N$ ($0<x2<1$), and the fourth semiconductor layer formed of $Al_{x3}Ga_{y3}In_{z3}N$ ($0<x3<1$, $0<y3<1$, $0≤z3<1$, $x3+y3+z3=1$), a band bending region is formed on the boundary between these layers due to the difference in the band gap between these materials. In this band bending region, a two-dimensional electron gas layer having high mobility in the horizontal direction is formed.

Here, the third semiconductor layer provided in the LED element according to the present invention has a film thickness of greater than or equal to 10 nm which is adequately larger than the film thickness (for example, about 2 nm) of InGaN formed so as to constitute a well layer of a general MQW structure. In a general MQW structure, the film thickness of InGaN is about 2 nm, and is less than or equal to 7 nm at maximum so as to prevent the reduction in the light emission rate by the quantum Stark effect.

By making the film thickness of the third semiconductor layer large, it is possible to broaden the substantially flat band region formed by $In_{x2}Ga_{1-x2}N$ and to increase the capacity for ensuring electrons. Until electrons are adequately accumulated in this region, electrons cannot cross the barrier formed by $Al_{x3}Ga_{y3}In_{z3}N$ that constitutes the fourth semiconductor layer. During this period, the two-dimensional electron gas migrates in the direction parallel with the boundary, and thus electrons diffuse in the horizontal direction.

In other words, after electrons have adequately diffused in the horizontal direction, and an adequate amount of electrons has been accumulated in the band bending region and the substantially flat band region, electrons cross the barrier of $Al_{x3}Ga_{y3}In_{z3}N$ to migrate to the side of the fifth semiconductor layer formed of the p-type nitride semiconductor. In other words, before the current flows from the side of the p-type semiconductor layer (the fifth semiconductor layer) to the side of the n-type semiconductor layer (the first semiconductor layer), electron spreading in the horizontal direction is temporarily realized. As a result of this, the current flowing in the heterostructure spreads in the horizontal direction, so that light emission in the entire heterostructure is enabled, and the emission efficiency can be increased.

A conventional semiconductor light emitting element is configured to have a MQW made up of a multiperiodic structure of InGaN/AlGaN on top of the n-type semiconductor layer. Here, as the n-type semiconductor layer situated beneath the MQW, GaN or AlGaN is used in accordance with the emission wavelength. The lattice constant of InN is 0.3540 nm in the a-axis direction, and is 0.5705 nm in the c-axis direction. That is, InGaN is a mixed crystal containing InN having a lattice constant larger than that of GaN or AlGaN. Therefore, for the InGaN layer that constitutes the MQW, a compressive stress arises, and piezoelectric polarization (piezo polarization) occurs for the InGaN layer by this stress.

FIG. 1 schematically shows an energy band diagram of MQW constituted of InGaN/AlGaN. In FIG. 1, (a) is an energy band diagram that is schematically depicted while the internal field caused by the piezoelectric polarization is not taken into account, and (b) is an energy band diagram that is schematically depicted while the internal field is taken into account.

As illustrated in FIG. 1(a), when the internal field does not exist, the energy band diagram is flat. However, actually the internal field exists in the MQW as described above. Since an electron and a hole are electrically opposite, the internal field acts as a force acting in the direction of spatially separating the electron and the hole from each other. In other words, under the influence of the internal field, the wave function of electron and the wave function of hole are separated from each other, and the recombination probability decreases. This also emerges in the forms of a conduction band 101 and a valance band 102 shown in FIG. 1(b).

As described above, by the internal field, the force acts in the direction of separating the wave function of electron and the wave function of hole from each other. Conventionally, for improving the emission efficiency, a light emitting element was formed while the well width of MQW was narrowed, or in other words, the InGaN film thickness was thinned. The well width in a general MQW structure is about less than or equal to 2 nm as described above.

In the configuration of the present invention, however, the flat band region is broadened by making the film thickness of the third semiconductor layer formed of $In_{x2}Ga_{1-x2}N$ larger than that of the conventional MQW, and spreading of electrons by the two-dimensional electron gas is utilized. Therefore, the problem of the distortion of the band by the lattice mismatch is more marked as compared with the conventional MQW configuration.

For addressing this problem, the LED element of the present invention has a second semiconductor layer formed of quaternary mixed crystals of $Al_{x1}Ga_{y1}In_{z1}N$ ($0<x1<1$, $0<y1<1$, $0<z1<1$, $x1+y1+z1=1$) between the first semiconductor layer and the heterostructure as in the aforementioned configuration. Since the second semiconductor layer is constituted of a nitride semiconductor layer containing In as is the case with the third semiconductor layer, the difference in the lattice constant between the second semiconductor layer and the third semiconductor layer is small. Therefore, it is possible to reduce the internal field arising within the heterostructure in comparison with the case where the heterostructure is formed on top of the first semiconductor layer without providing the second semiconductor layer.

Here, it is more preferred that film thickness of the second semiconductor layer is greater than or equal to 10 nm. By forming the second semiconductor layer to have a large film thickness, the effect of relaxing the difference in the lattice constant is improved, and the internal field within the heterostructure can be further reduced. Further, by setting the film thickness to be greater than or equal to 10 nm, the surface morphology of the $Al_{x1}Ga_{y1}In_{z1}N$ layer can be ameliorated. It is preferred that the second semiconductor layer has a critical film thickness or smaller that will not cause a crystal defect.

Further, in the above configuration, the heterostructure may be formed directly on the second semiconductor layer, or may be formed on top of the second semiconductor layer with a nitride semiconductor layer having a film thickness of about 1 to 2 nm interposed therebetween.

Hereinafter, the second semiconductor layer is also referred to as "AlGaInN", and this is merely an abbreviation for the composition ratio of Al, Ga, In and N, and is not intended to limit the case where the composition ratio is 1:1. The same applies to the references to "AlGaN" and "InGaN".

Here, the first semiconductor layer can be formed of AlGaN.

The film thickness of the third semiconductor layer can be greater than or equal to 10 nm and less than or equal to 25 nm. As will be described later in the section of "MODE FOR CARRYING OUT THE INVENTION", it was found that when the film thickness of the third semiconductor layer was set to be larger than 25 nm, for example, 30 nm, the problem such as a crystal defect became obvious and the light output was sometimes reduced. In other words, it is preferred that the film thickness of the third semiconductor layer is a critical film thickness or smaller that will not cause a crystal defect. By employing such a configuration, it is possible to obtain a still higher light output compared with a conventional LED element. By setting the film thickness of the third semiconductor layer within this range, the effect of improving the resisting pressure of the element against ESD (Electro Static Discharge) can also be obtained.

The heterostructure may be made up of repeated multiple periods of the third semiconductor layer and the fourth semiconductor layer.

When such a configuration is employed, the boundary of heterojunction is formed plurally, so that the region where the two-dimensional electron gas layer is formed is also formed plurally. Also, the substantially flat band region formed of $In_{x2}Ga_{1-x2}N$ that functions as an electron accumulating layer is also formed plurally. As a result of this, it is possible to further increase the effect of current spreading, and it is possible to further improve the light output.

The fourth semiconductor layer may be formed of $Al_{x3}Ga_{1-x3}N$ (0<x3<1). As a result of the diligent study, the present inventors found that in the case where the heterostructure is periodically repeated multiple times, the light output is improved by providing the second semiconductor layer constituted of a quaternary mixed crystal layer of $Al_{x1}Ga_{y1}In_{z1}N$ between the heterostructure and the first semiconductor layer even when every fourth semiconductor layer is formed of $Al_{x3}Ga_{1-x3}N$. When the second semiconductor layer is formed directly below the heterostructure on the side of the first semiconductor layer, the second semiconductor layer constitutes a first barrier layer (first barrier).

The fourth semiconductor layer may be an undoped layer, or may be an n-type semiconductor layer. By doping the fourth semiconductor layer with Si so as to render it an n-type semiconductor layer, it is possible to improve the light output of the LED element. According to the configuration of the present invention, it is possible to increase the Si doping concentration in comparison with the conventional LED element having a MQW, and thus it is possible to obtain the effect of reducing the operation voltage at the time of injection of high electrical current.

The LED element according to the present invention can be an element of which the peak emission wavelength is greater than or equal to 362 nm and less than or equal to 395 nm.

Effect of the Invention

In the LED element of the present invention, since the active layer (heterostructure) is configured to have a larger film thickness compared with the conventional LED element having a MQW, the current spreading in the horizontal direction within the active layer is ensured compared with the conventional case, and the emission efficiency is improved. Since the difference in the lattice constant is relaxed by the second semiconductor layer provided in the LED element of the present invention, the problem caused by lattice mismatch in the n-type semiconductor layer adjacent to the active layer is also solved.

BRIEF DESCRIPTION OF THE DRAWINGS

FIG. 4 is a graph showing the relation between the peak emission wavelength of the LED element and the light output when the In composition of the third semiconductor layer is varied.

FIG. 10 is a schematic section view showing a structure of a conventional LED element.

MODE FOR CARRYING OUT THE INVENTION

Structure

Figure 1:
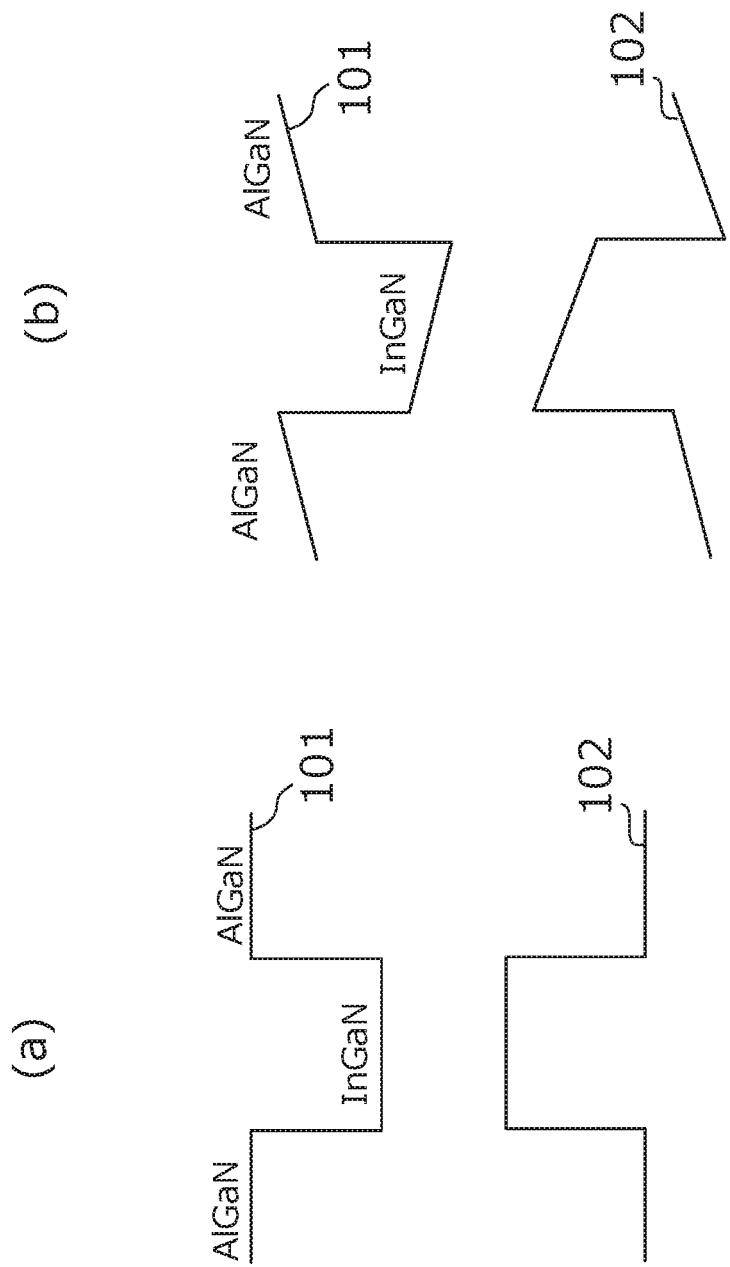
FIG. 1 is a diagram schematically showing energy bands of MQW formed of InGaN/AlGaN.
Figure 2:
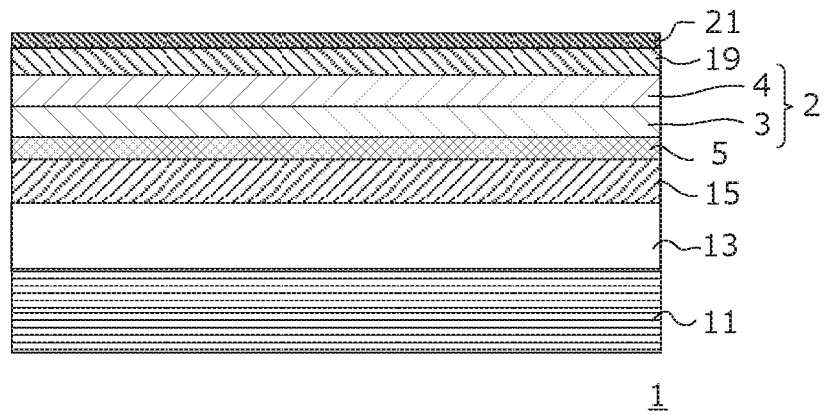
FIG. 2 is a schematic section view showing a structure of an LED element of the present invention.

FIG. 2 is a schematic section view showing a structure of an LED element of the present invention. In the following drawings, the actual dimensional ratio and the dimensional ratio on drawings do not necessarily coincide with each other.

A LED element 1 has an undoped layer 13 on top of a growth substrate 11 of sapphire or the like, and a first semiconductor layer 15 formed of an n-type nitride semiconductor on top of the undoped layer 13. The first semiconductor layer 15 constitutes an n-type cladding layer.

The LED element 1 further has, on top of the first semiconductor layer 15, a second semiconductor layer 5 formed of quaternary mixed crystals of $Al_{x1}Ga_{y1}In_{z1}N$ (0<x1<1, 0<y1<1, 0<z1<1, x1+y1+z1=1). The LED element 1 also has, on top of the second semiconductor layer 5, a heterostructure 2 made up of a laminate structure of a third semiconductor layer 3 formed of $In_{x2}Ga_{1-x2}N$ (0<x2<1), and a fourth semiconductor layer 4 formed of $Al_{x3}Ga_{y3}In_{z3}N$ ($0<x3<1$, $0<y3<1$, $0\leq z3<1$, $x3+y3+z3=1$).

The LED element 1 further has, on top of the heterostructure 2, a fifth semiconductor layer 19 formed of a p-type nitride semiconductor. The fifth semiconductor layer 19 constitutes a p-type cladding layer. The LED element 1 shown in FIG. 2 has, on top of the fifth semiconductor layer 19, a p-type contact layer 21 doped with a high concentration of a p-type impurity. Hereinafter, the configuration of the LED element 1 will be specifically described.

(Growth Substrate 11)

The growth substrate 11 is constituted of a sapphire substrate. The growth substrate 11 may be formed of Si, SiC, GaN, YAG or the like besides sapphire.

(Undoped Layer 13)

The undoped layer 13 is formed of GaN. More specifically, the undoped layer 13 is formed of a low-temperature buffer layer formed of GaN, and an under layer formed of GaN on top of the low-temperature buffer layer.

(First Semiconductor Layer 15)

The first semiconductor layer 15 is formed of an n-AlGaN in this embodiment, and is doped with Si, Ge, S, Se, Sn, Te or the like as an n-type impurity. A layer formed of n-GaN (protective layer) may be contained in the region being in contact with the undoped layer 13. In this case, the protective layer is doped with an n-type impurity such as Si, Ge, S, Se, Sn, or Te, and is particularly preferably doped with Si. In the present embodiment, as one example, the first semiconductor layer 15 is formed of n-$Al_{0.1}Ga_{0.9}N$.

The first semiconductor layer 15 may be formed of n-GaN.

(Fifth Semiconductor Layer 19)

The fifth semiconductor layer 19 is formed of p-AlGaN in the present embodiment, and is doped with a p-type impurity such as Mg, Be, Zn, or C. In the present embodiment, as one example, the fifth semiconductor layer 19 is formed by a laminate structure of p-$Al_{0.3}Ga_{0.7}N$ and p-$Al_{0.07}Ga_{0.93}N$. A layer formed of GaN (protective layer) may be contained in the region being in contact with the p-type contact layer 21. In this case, the protective layer may be doped with a p-type impurity such as Mg, Be, Zn, or C.

(P-Type Contact Layer 21)

The p-type contact layer 21 is formed, for example, of p-GaN. In particular, doping with a high concentration of a p-type impurity such as Mg, Be, Zn, or C results in the p-type contact layer 21 constituted of a $p^+$-GaN layer.

(Second Semiconductor Layer 5)

The second semiconductor layer 5 is formed of quaternary mixed crystals of $Al_{x1}Ga_{y1}In_{z1}N$ ($0<x1<1$, $0<y1<1$, $0<z1<1$, $x1+y1+z1=1$). In the present embodiment, description will be made for the exemplary case where the second semiconductor layer 5 is formed of $Al_{0.06}Ga_{0.92}In_{0.02}N$ having a film thickness of 20 nm.

(Heterostructure 2)

As described above, the heterostructure 2 is constituted of a laminate structure of the third semiconductor layer 3 formed of $In_{x2}Ga_{1-x2}N$ ($0<x2<1$), and the fourth semiconductor layer 4 formed of $Al_{x3}Ga_{y3}In_{z3}N$ ($0<x3<1$, $0<y3<1$, $0\leq z3<1$, $x3+y3+z3=1$). In the present embodiment, the heterostructure 2 constitutes an active layer of the LED element 1. That is, the third semiconductor layer 3 formed of $In_{x2}Ga_{1-x2}N$ constitutes a light emitting layer, and the fourth semiconductor layer 4 formed of $Al_{x3}Ga_{y3}In_{z3}N$ constitutes a barrier layer.

In the present embodiment, description will be made for the exemplary case where the third semiconductor layer 3 is formed of $In_{0.02}Ga_{0.98}N$ having a film thickness of 15 nm, and the fourth semiconductor layer 4 is formed of n-$Al_{0.06}Ga_{0.94}N$ having a film thickness of 20 nm.

By the way, the active layer 94 provided in the conventional LED element 1 shown in FIG. 10 was formed by periodically repeating InGaN that forms a light emitting layer and AlGaN that forms a barrier layer multiple times. More specifically, the AlGaN layers are formed in a manner of sandwiching an InGaN layer that constitutes a light emitting layer.

On the other hand, in the LED element 1, the second semiconductor layer 5 formed of $Al_{x1}Ga_{y1}In_{z1}N$ constitutes the first barrier layer (first barrier) on the n-side. In comparison with the second semiconductor layer 5 formed of $Al_{x1}Ga_{y1}In_{z1}N$, and the fourth semiconductor layer 4 formed of $Al_{x3}Ga_{y3}In_{z3}N$, the band gap of the third semiconductor layer 3 formed of $In_{x2}Ga_{1-x2}N$ is small. Therefore, the second semiconductor layer 5 and the fourth semiconductor layer 4 constitute a barrier layer, and the third semiconductor layer 3 constitutes a light emitting layer.

Figure 3:
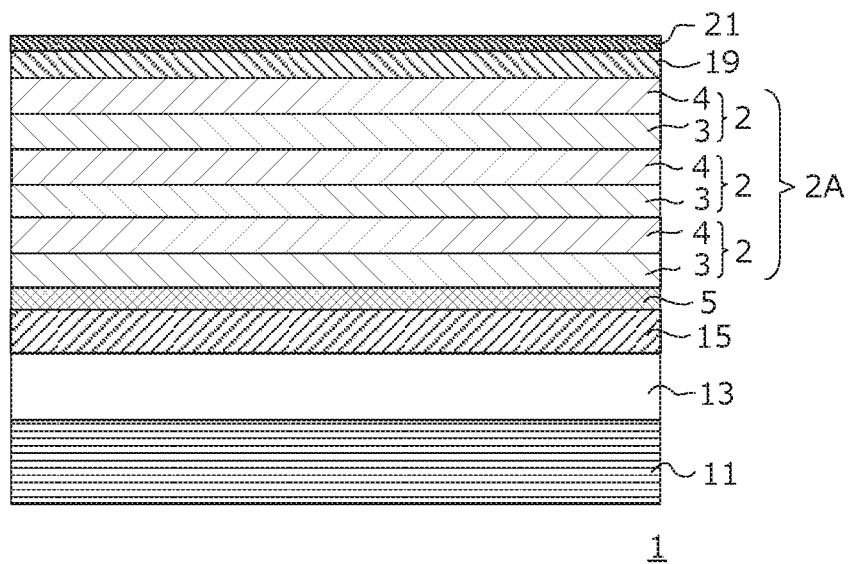
FIG. 3 is a schematic section view showing another structure of an LED element of the present invention.

As shown in FIG. 3, the LED element 1 may have a multilayer structure part 2A formed by periodically repeating the heterostructure 2 multiple times. In this case, the third semiconductor layer 3 formed on the side of the n-layer, namely at the position nearest to the first semiconductor layer 15 constitutes a light emitting layer sandwiched by the second semiconductor layer 5 and the fourth semiconductor layer 4. The third semiconductor layers 3 other than the third semiconductor layer 3 formed at the position nearest to the first semiconductor layer 15 constitute a plurality of light emitting layers sandwiched by the fourth semiconductor layers 4.

In the LED element 1 shown in FIG. 3, on top of the fourth semiconductor layer 4 situated at the uppermost layer of the multilayer structure part 2A, the fifth semiconductor layer 19 and the p-type contact layer 21 are provided. The fourth semiconductor layer 4 situated at the uppermost layer of the multilayer structure part 2A constitutes a last barrier layer (last barrier).

While FIG. 3 discloses the configuration having the multilayer structure part 2A in which the heterostructure 2 is periodically repeated three times, the number of periodical repetition is not limited to 3. For example, the number of periodical repetition may be five or other number.

In place of the configuration of FIG. 3, such a configuration that the fourth semiconductor layer 4 is provided directly on the second semiconductor layer 5, and then the third semiconductor layer 3 and the fourth semiconductor layer 4 are laminated alternately may be applicable. In this case, the fourth semiconductor layer 4 formed at the position nearest to the first semiconductor layer 15 constitutes a first barrier. In this case, every third semiconductor layer 3 is sandwiched by a plurality of the fourth semiconductor layers 4.

[Description of Function of Heterostructure 2]

Hereinafter, improvement in emission efficiency in the LED element 1 compared with the conventional LED element 90 by having the heterostructure 2 of the aforementioned configuration will be described by referring to Examples. In the following description, description will be made on the assumption that the In composition contained in the fourth semiconductor layer formed of $Al_{x3}Ga_{y3}In_{z3}N$ is 0% (namely z3=0). However, the same discussion is applicable also when the fourth semiconductor layer is formed of $Al_{x3}Ga_{y3}In_{z3}N$ containing 5% or less of In.

In the following description, as the LED element 90 used for comparative verification, the one formed by alternately laminating InGaN having a film thickness of 2 nm and AlGaN having a film thickness of 5 nm periodically five times was employed as the active layer 94 formed by a MQW.

(Discussion about Peak Emission Wavelength)

FIG. 4 is a graph showing the relation between the peak emission wavelength of the LED element 1 and the light output when the In composition of the third semiconductor layer 3 ($In_{x2}Ga_{1-x2}N$) constituting the heterostructure 2, namely the x2 value is varied.

Here, as the LED element 1, the configuration having the second semiconductor layer 5 formed of $Al_{0.08}Ga_{0.91}In_{0.01}N$ having a film thickness of 15 nm on top of the first semiconductor layer 15 which is an n-type semiconductor layer, and having the multilayer structure part 2A on top of the second semiconductor layer 5 is employed. The multilayer structure part 2A is formed by periodically repeating five times the heterostructure 2 made up of the third semiconductor layer 3 formed of $In_{0.92}Ga_{0.98}N$ having a film thickness of 15 nm, and the fourth semiconductor layer 4 formed of n-$Al_{0.06}Ga_{0.94}N$ having a film thickness of 20 nm.

For comparison, FIG. 4 also includes the data of the conventional LED element 90 in which the second semiconductor layer 5 and the heterostructure 2 are not provided. As described above, the LED element 90 has the active layer 94 formed by alternately laminating InGaN having a film thickness of 2 nm and AlGaN having a film thickness of 5 nm periodically five times.

In FIG. 4, an element of 350 μm square is used for both of the LED element 1 and the conventional LED element 90, and the light output when a current of 0.1 A is injected into each element is measured. This corresponds to the case where the current density of the element is set to be 100 A/cm$^2$. This current density corresponds to the targeted value in designing a high injection device. The current density at the time of designing a low injection device is about 20 to 30 A/cm$^2$.

According to FIG. 4, it can be found that in the range D1 in which the emission wavelength is greater than or equal to 362 nm and less than or equal to 395 nm, the light output is improved in the LED element 1 of the present invention than in the conventional LED element 90. On the other hand, at the emission wavelength of 357 nm which is shorter than 362 nm, and at 400 nm, 410 nm, and 420 nm which are longer than 395 nm, the light output is higher in the conventional LED element 90 than in the LED element 1. This result would suggest the following facts.

Figure 5A:
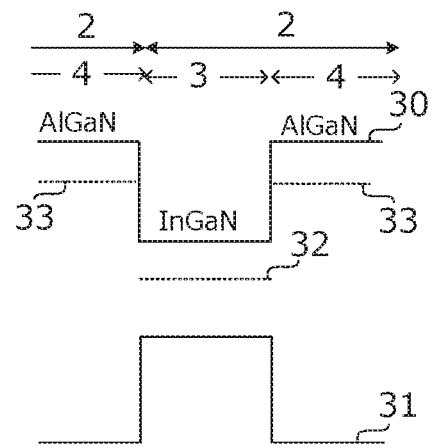
FIG. 5A schematically shows an ideal energy band diagram of a heterostructure.
Figure 5B:
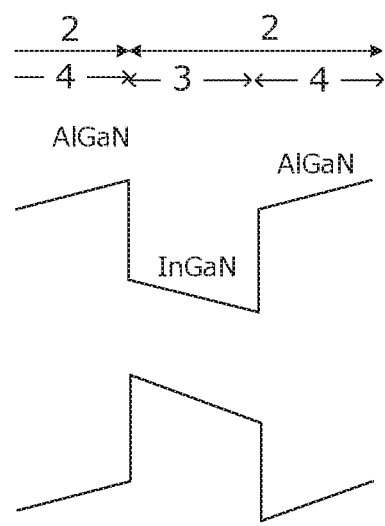
FIG. 5B schematically shows an energy band diagram of a heterostructure while the influence of piezo field is taken into account.
Figure 5C:
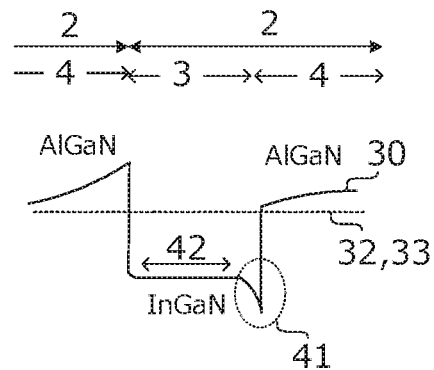
FIG. 5C schematically shows an energy band diagram of a conduction band of a heterostructure while the influence of the interaction of semiconductor materials is taken into account.

FIG. 5A, FIG. 5B, and FIG. 5C each schematically show an energy band diagram of the heterostructure 2. In FIG. 5A, the third semiconductor layer 3 is indicated by "InGaN", and the fourth semiconductor layer 4 is indicated by "AlGaN".

AlGaN has a larger band gap than InGaN. Therefore, as shown in FIG. 5A, a substantially flat band region is formed by the third semiconductor layer 3 (AlGaN) sandwiched between the fourth semiconductor layers 4 (AlGaN) if the influence of the internal field is not taken into account. While FIG. 5A to FIG. 5C illustrate the case where the heterostructure 2 is periodically repeated multiple times, the same discussion can be made by replacing the fourth semiconductor layer 4 of the n layer side with the second semiconductor layer 5 ($Al_{x1}Ga_{y1}In_{z1}N$) when only one period of the heterostructure 2 is formed.

Here, as previously mentioned, the film thickness of the third semiconductor layer 3 (InGaN) is 15 nm in the present example, which is much larger than 2 nm which is the film thickness of InGaN forming the active layer 94 of the conventional LED element 90. Therefore, in the region of the third semiconductor layer 3, the substantially flat band region is broadly formed.

In the LED element 1, piezoelectric polarization (piezo polarization) arises in the c-axis direction which is perpendicular to the plane of the flat band region formed by the third semiconductor layer 3 (InGaN). FIG. 5B schematically shows the energy band of the heterostructure 2 depicted while the influence of the piezo field is taken into account. The piezo field causes occurrence of distortion in the energy band.

As the distortion of the energy band increases, overlapping between the wave function of an electron and the wave function of a hole reduces, and the rate of light emission caused by recombination an electron and a hole reduces. This is called a quantum Stark effect. The distortion increases as the In composition ratio of the third semiconductor layer 3 (InGaN) increases. The reduction in the light output in the LED element 1 having a peak emission wavelength of greater than or equal to 400 nm as compared with the conventional LED element 90 would be ascribable to emergence of the quantum Stark effect due to the high In composition ratio. Also the aforementioned influence of the misfit dislocation resulting from the difference in the lattice constant would be unignorable.

On the other hand, for realizing the light having a peak emission wavelength of 357 nm that is lower than 360 nm, it is necessary to set the In ratio of the third semiconductor layer 3 (InGaN) to be extremely small. In the case of the conventional LED element 90, since the film thickness of InGaN forming the active layer 94 is about 2 nm, a small amount of In can be added, and an optimum In ratio for realizing the light of such a short wavelength can be realized. In the LED element 1 containing the third semiconductor layer 3 (InGaN) having a film thickness of 15 nm, however, the content of In is high for the larger film thickness of the third semiconductor layer 3 (InGaN), and it is difficult to realize the light of the short wavelength around 357 nm. Accordingly, when LED elements having a peak emission wavelength of 357 nm are realized, the light output is higher in the conventional LED element 90 than in the LED element 1.

On the other hand, in the range D1 where the peak emission wavelength is greater than or equal to 362 nm and less than or equal to 395 nm, the light output is higher in the LED element 1 of the present invention than in the conventional LED element 90. The conceivable reason for this is as follows.

As shown in FIG. 5A, the fourth semiconductor layer 4 (AlGaN layer) has a larger electronic band gap compared with the third semiconductor layer 3 (InGaN). FIG. 5A shows a conduction band 30, a valance band 31, and a Fermi level 32 of the third semiconductor layer 3, and a Fermi level 33 of the fourth semiconductor layer 4. In FIG. 5A, interaction between InGaN and AlGaN is not taken into account.

FIG. 5C schematically shows the condition of the conduction band 30 in which the interaction between two semiconductor materials is taken into account. While the Fermi levels 32 and 33 are mutually equivalent to each other, the conduction band of the fourth semiconductor layer 4 (AlGaN) near the p-layer is drawn below due to the discontinuity of the energy bands of AlGaN and InGaN, and a band bending region 41 arises. Within the band bending region 41, a two-dimensional electron gas layer having high mobility in the horizontal direction is formed. Also, as described above, by setting the film thickness of the third semiconductor layer 3 (InGaN) to be large, a substantially flat band region 42 broadens, and a large amount of electrons can be accumulated. Therefore, electrons will not exceed the potential of the fourth semiconductor layer 4 and will not overflow until the electrons are accumulated in the band bending region 41 formed on the boundary between the third semiconductor layer 3 and the fourth semiconductor layer 4, and in the substantially flat band region 42 of the third semiconductor layer 3. In other words, migration of electrons in the horizontal direction is attempted, and as a result, spreading of the current in the horizontal direction can be realized. In other words, by the heterojunction between the third semiconductor layer 3 and the fourth semiconductor layer 4, the function of spreading the current in the horizontal direction (current diffusing function) is realized.

These reveal that according to the configuration of the LED element 1, the effect of improving the light output than before is obtained particularly in the range where the peak emission wavelength is greater than or equal to 362 nm and less than or equal to 395 nm.

Figure 5D:
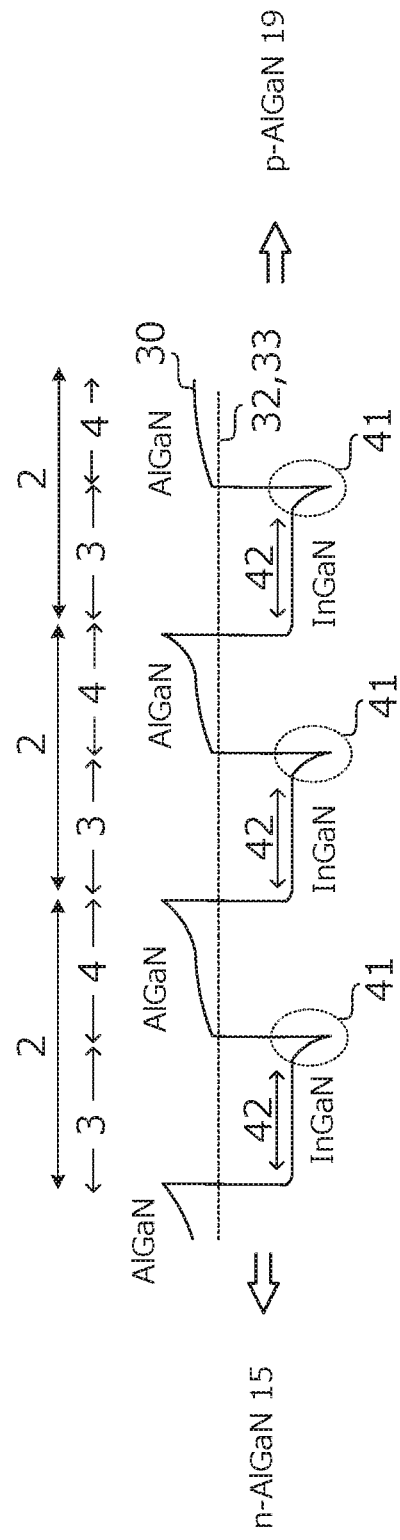
FIG. 5D schematically shows an energy band diagram of a conduction band of a heterostructure while the influence of the interaction of semiconductor materials is taken into account.

As described above by referring to FIG. 3, the LED element 1 may have the multilayer structure part 2A formed by periodically repeating the heterostructure 2 multiple times. FIG. 5D schematically shows an energy band diagram of the conduction band 30 of the heterostructure 2 in the same manner as in FIG. 5C, in the LED element 1 having multiple periods of the heterostructure 2.

According to FIG. 5D, by having multiple periods of the heterostructure 2, it is possible to plurally provide the band bending region 41 showing the function of spreading the current in the horizontal direction, and the substantially flat band region 42 showing the function of accumulating electrons. As a result, it is possible to further improve the effect of spreading the current.

(Discussion about Second Semiconductor Layer 5)

As described above by referring to FIG. 5A to FIG. 5D, according to the LED element 1, by having the heterostructure 2 containing the third semiconductor layer 3 having a larger film thickness than the conventional MQW, the effect of spreading the current is improved, and thus the light output is improved.

By the way, as described above by referring to FIG. 2 to FIG. 3, the LED element 1 is formed by growing the heterostructure 2 on top of the undoped layer 13 formed of GaN formed on the growth substrate 11 while the n-type first semiconductor layer 15 is interposed therebetween. The third semiconductor layer 3 is formed of InGaN, and InGaN has a larger lattice constant than GaN or AlGaN.

Therefore, it is expected that piezoelectric polarization that is higher than that of the conventional MQW occurs in the heterostructure 2 formed by growing InGaN having a larger film thickness than that of the conventional MQW. For relaxing the piezoelectric polarization, the LED element 1 of the present invention has the second semiconductor layer 5 formed of quaternary mixed crystals of $Al_{x1}Ga_{y1}In_{z1}N$ between the first semiconductor layer 15 and the heterostructure 2. Since the second semiconductor layer 5 is constituted of a semiconductor layer containing In, the lattice constant of the second semiconductor layer 5 approximates to the lattice constant of the third semiconductor layer 3 formed of InGaN. That is, by growing the second semiconductor layer 5, it is possible to weaken the internal field to the third semiconductor layer 3 to be grown thereon.

Figure 6:
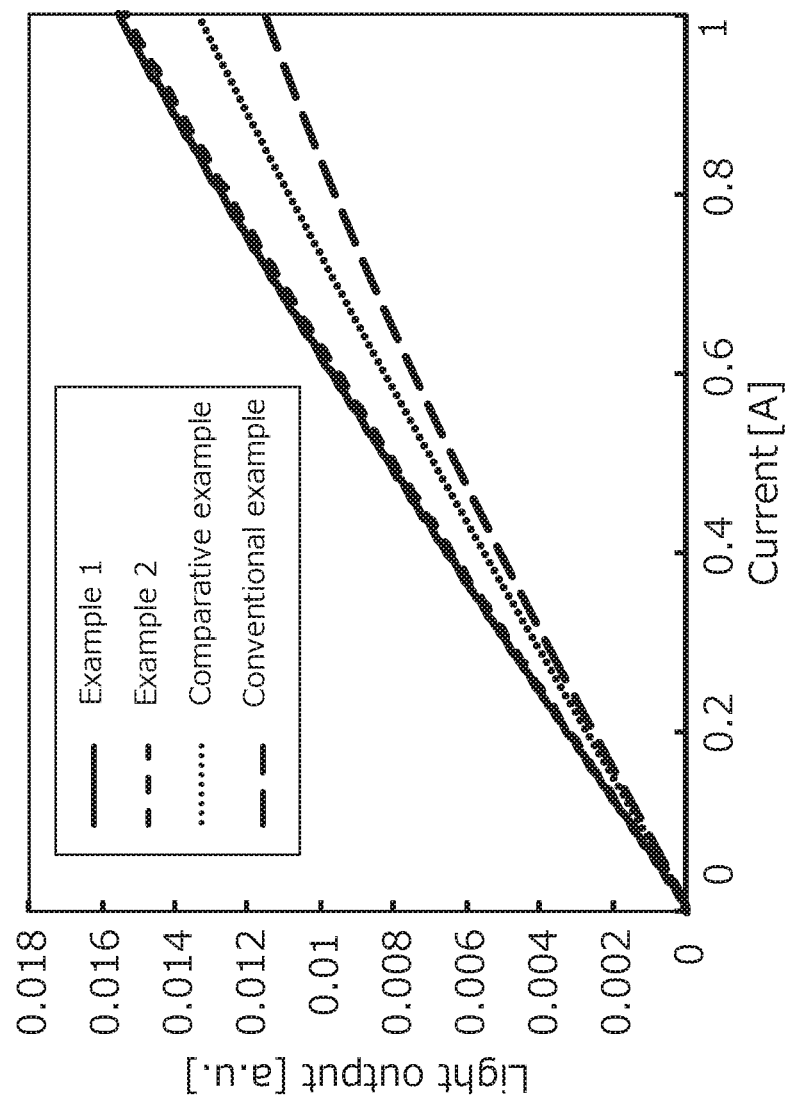
FIG. 6 is a graph comparing the light output among the LED elements of Example 1, Example 2, Reference example, and Conventional example.

FIG. 6 is a graph comparing the light output among the LED elements 1 having the second semiconductor layer 5 (Example 1, Example 2), the LED element not having the second semiconductor layer 5 (Comparative example), and the conventional LED element 90 (Conventional example).

The LED element 1 of Example 1 has such a structure that on top of the second semiconductor layer 5 formed of $Al_{0.08}Ga_{0.905}In_{0.015}N$ having a film thickness of 50 nm, the heterostructure 2 made up of the third semiconductor layer 3 formed of $In_{0.015}Ga_{0.985}N$ having a film thickness of 15 nm and the fourth semiconductor layer 4 formed of n-$Al_{0.08}Ga_{0.92}N$ having a film thickness 20 nm is periodically laminated five times.

The LED element 1 of Example 2 has such a structure that on top of the second semiconductor layer 5 formed of $Al_{0.08}Ga_{0.905}In_{0.015}N$ having a film thickness of 20 nm, the heterostructure 2 made up of the third semiconductor layer 3 formed of $In_{0.015}Ga_{0.985}N$ having a film thickness of 15 nm, and the fourth semiconductor layer 4 formed of n-$Al_{0.08}Ga_{0.905}In_{0.015}N$ having a film thickness of 20 nm is periodically laminated five times. In other words, Example 2 is different from Example 1 in that every fourth semiconductor layer 4 is constituted of a layer of quaternary mixed crystals of AlGaInN.

The LED element of Reference example is different from the LED element 1 of Example 1 in that it does not have the second semiconductor layer 5. That is, directly on the first semiconductor layer 15, the heterostructure 2 made up of the third semiconductor layer 3 formed of $In_{0.015}Ga_{0.985}N$ having a film thickness of 15 nm and the fourth semiconductor layer 4 formed of n-$Al_{0.08}Ga_{0.92}N$ having a film thickness 20 nm is periodically laminated five times.

The LED element 90 of the Conventional example has the active layer 94 made up of a well layer formed of $In_{0.02}Ga_{0.98}N$ having a film thickness of 2 nm and a barrier layer formed of n-$Al_{0.08}Ga_{0.92}N$ having a film thickness of 5 nm periodically repeated five times, directly on the n-type cladding layer 93.

FIG. 6 is a graph comparing the light output when each LED element as described above is supplied with the current, and the horizontal axis represents the applied current value, and the vertical axis represents the light output. According to FIG. 6, Example 1 and Example 2 show substantially equivalent light outputs, and in both of these Examples, a light output higher than those in Reference example and Comparative example is realized. In Reference example, a light output higher than that in Conventional example is realized.

As described above, by having the heterostructure 2, it is possible to realize the current spreading in the horizontal direction as compared with the conventional LED element 90. This also emerges as the improvement in light output in the element of Reference example than in the element of Conventional example in FIG. 6.

Then according to FIG. 6, each element of Example 1 and Example 2 having the second semiconductor layer 5 shows further improved light output compared with the element of Reference example. This suggests that in Example 1 and Example 2 having the second semiconductor layer 5, the internal field in the heterostructure 2 is relaxed and the recombination probability is improved compared with Conventional example.

Further, according to FIG. 6, there is little difference in the light output between Example 1 and Example 2. This suggests that the internal field in the third semiconductor layer 3 can be reduced by growing the second semiconductor layer 5 formed of AlGaInN for relaxing the difference in the lattice constant at least in the stage previous to growing the heterostructure 2.

Figure 7:
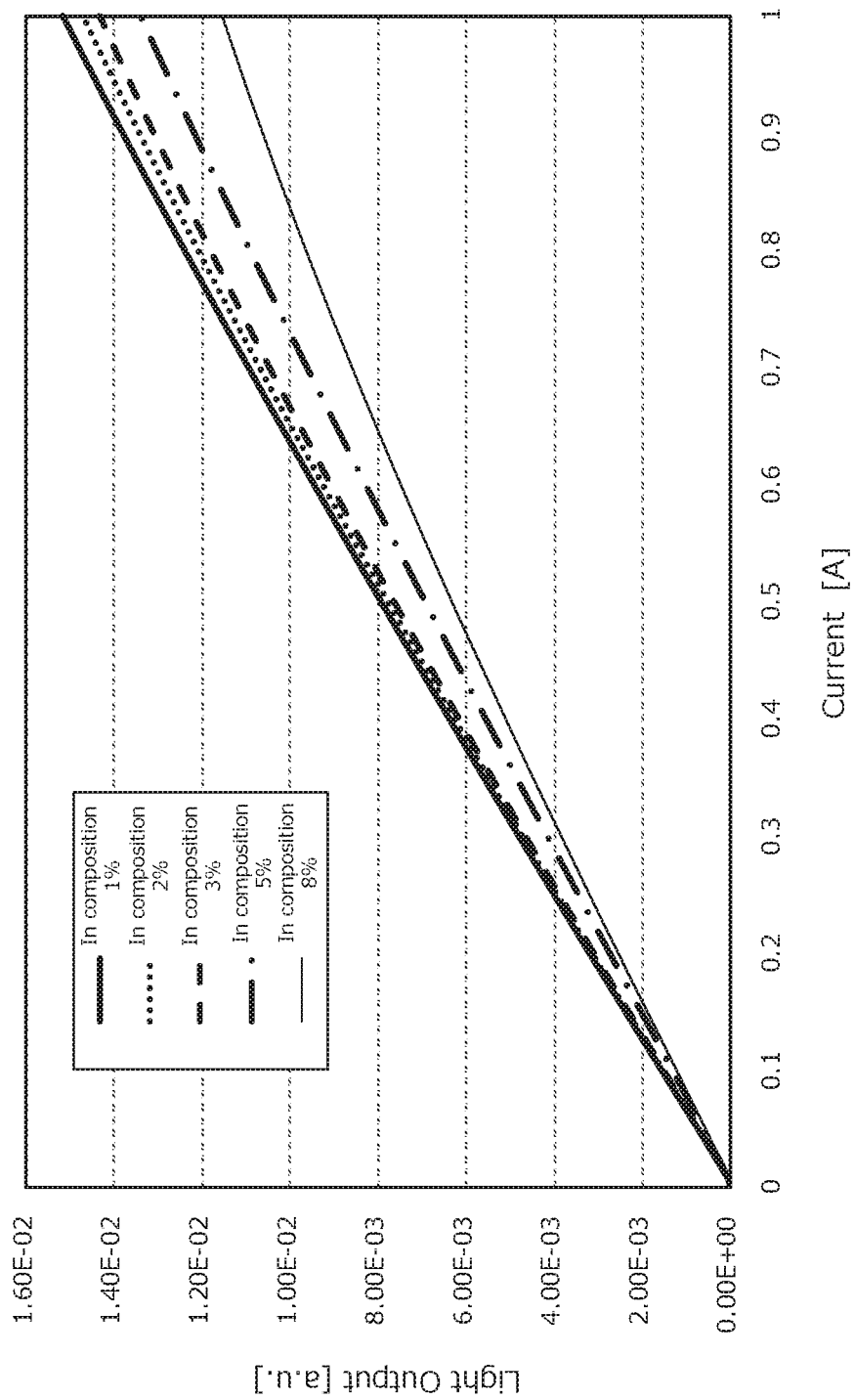
FIG. 7 is a graph comparing the light output among the LED elements that are produced with the varying In composition while the film thickness of the second semiconductor layer is constant.

FIG. 7 is a graph comparing the light output for various In compositions of the second semiconductor layer 5 at a peak emission wavelength of the LED element 1 of 365 nm band. The film thickness of the second semiconductor layer 5 is constantly 50 nm.

According to FIG. 7, when the In composition of the second semiconductor layer 5 is less than or equal to 5%, significant reduction in the light output is not observed, whereas when the In composition is 8%, small reduction in the light output is observed. It is inferred that part of the light radiated from the heterostructure 2 is absorbed within the second semiconductor layer 5 due to the increased In composition. Further, when the film thickness of the second semiconductor layer 5 is further increased, a crystal defect would be formed in the second semiconductor layer 5, and the light output would further reduce.

The In composition of the second semiconductor layer 5 formed of $Al_{x1}Ga_{y1}In_{z1}N$, namely the Z1 value, and the value of the film thickness of the second semiconductor layer 5 depend on the peak emission wavelength, namely the X2 value of the third semiconductor layer 3 formed of $In_{x2}Ga_{1-x2}N$. Since the internal field caused by the difference in the lattice constant increases as the X2 value increases, it is preferred to increase the Z1 value or increase the film thickness of the second semiconductor layer 5 for relaxing the internal field. On the other hand, when the Z1 value is too large, a crystal defect arises during growth, and thus the second semiconductor layer 5 cannot be stacked thickly.

Therefore, the second semiconductor layer 5 preferably has an In composition corresponding to the In composition of the third semiconductor layer 3 and has a film thickness (film thickness less than or equal to the critical film thickness) within the range where a crystal defect does not arise. For example, when the In composition of the second semiconductor layer 5 is 10%, it is preferred that the film thickness is greater than 0 nm and less than or equal to 50 nm.

(Discussion about Film Thickness of Third Semiconductor Layer 3)

As described above, since the third semiconductor layer 3 (InGaN) forms the substantially flat band region 42, it is preferred to make the film thickness of the third semiconductor layer 3 large in order to improve the ability to accumulate electrons. However, when the film thickness of the third semiconductor layer 3 is too large, lattice relaxation occurs due to the difference in the lattice constant between GaN and InGaN, with the result that it becomes impossible to accumulate electrons adequately in the band bending region 41 and the substantially flat band region 42.

Figures 8, 9:
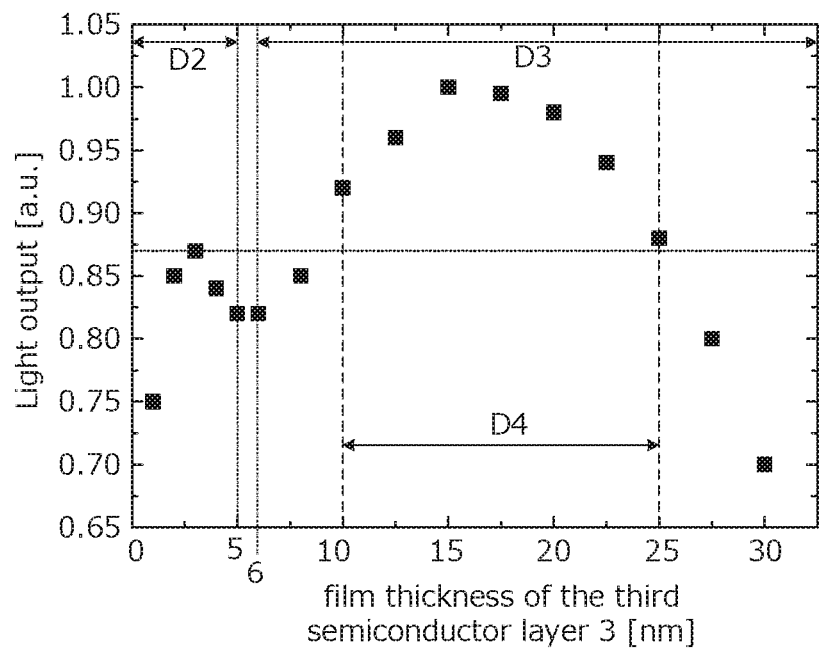
FIG. 8 is a graph showing the relation between the film thickness and the obtained light output when the film thickness of the third semiconductor layer is varied in the LED element.
FIG. 9 is a table showing yields of the LED elements of Example 1, Example 2, Reference example, and Comparative example.

FIG. 8 is a graph showing the relation between the film thickness and the obtained light output when the film thickness of the third semiconductor layer 3 is varied in the LED element 1. The In composition of the third semiconductor layer 3 is adjusted so that the peak emission wavelength is 365 nm.

According to FIG. 8, it can be seen that in a region D2 where the film thickness of the third semiconductor layer 3 is less than or equal to 5 nm, and in a region D3 where the film thickness of the third semiconductor layer 3 is greater than or equal to 6 nm, the relation between the light output and the film thickness changes. That is, in the region D2, the light output peaks when the film thickness is about 3 nm, and reduces as the film thickness further increases. The region D2 falls within the range of the film thickness where emission recombination is promoted by the use of the quantum effect by a so-called quantum well, and is considered as the region contributing to light emission of the conventional LED element 90.

In contrast to this, in a region D3 where the film thickness is greater than or equal to 6 nm, the light output starts rising as the film thickness of the third semiconductor layer 3 becomes large again, and peaks when the film thickness is about 15 nm, and the light output starts reducing as the film thickness becomes larger than about 15 nm. The region D3 is considered as being within the range of film thickness where light emission is promoted by the quantum effect utilizing the band bending region 41 in the heterojunction boundary between the third semiconductor layer 3 and the fourth semiconductor layer 4.

According to FIG. 8, when the LED element 1 is so configured that the film thickness of the third semiconductor layer 3 is set within the range of greater than or equal to 10 nm and less than or equal to 25 nm (region D4), the light output can be improved than before, as compared with the region D2 of the film thickness that is conventionally used as the MQW configuration. When the LED element 1 is so configured that the film thickness of the third semiconductor layer 3 is larger than 25 nm, the misfit dislocation by a crystal defect due to the aforementioned lattice relaxation emerges, and the uniformity of the in-plane current decreases, and this would reduce the light output compared with the conventional configuration.

When the film thickness of the third semiconductor layer 3 is extremely small, inclination is formed also in the substantially flat band region 42 due to the large influence by the internal field as described above, and the ability to accumulate electrons is reduced. In contrast to this, when the film thickness is made as large as 15 nm, the flat band region 42 extends, and the ability to accumulate electrons increases. Electrons having a potential exceeding the Fermi level (32, 33) flow into the p-layer side (right in FIG. 5D). Therefore, when the film thickness of the third semiconductor layer 3 is extremely small, the current flows into the LED element before the electrons have been adequately accumulated, so that the effect of adequately diffusing the current cannot be obtained. In contrast to this, by making the film thickness of the third semiconductor layer 3 as large as greater than or equal to 10 nm, a large quantity of electrons can be accumulated in the flat band region 42, so that it is possible to diffuse the electrons by the two-dimensional electron gas formed by the band bending region 41 before the electrons come to have a potential exceeding the Fermi level. As a result of this, a current diffusing effect is obtained and the effect of improving the light output is obtained.

The foregoing reveals that by setting the film thickness of the third semiconductor layer 3 to be greater than or equal to 10 nm and less than or equal to 25 nm, the effect of further improving the light output of the LED element 1 can be obtained.

Further, as in the LED element 1 of the present invention, by setting the film thickness of the third semiconductor layer 3 to be larger than that of the InGaN layer provided in the conventional LED element 90, the pressure resistance characteristics of the pressure LED element itself against ESD is improved, and the effect of improving the yield is obtained. FIG. 9 is a table showing yields of the LED elements of Example 1, Example 2, Reference example, and Comparative example.

For each LED element of Example 1, Example 2, Reference example, and Comparative example, after applying the forward voltage and the reverse voltage of 500V, the reverse current flowing when −5 V was added as a reverse bias was measured. At this time, the yield was measured while the element showing an absolute value of the reverse current of less than or equal to (less than) 5 µA was regarded as a good element, and the element showing an absolute value of the reverse current of greater than 5 µA was regarded as a no-good element.

According to FIG. 9, the LED elements of Example 1 and Example 2 showed higher yield than the LED element of Reference example, and the LED element of Reference example showed higher yield than the LED element of Conventional example.

As described above, the third semiconductor layer 3 (InGaN) provided in each of the respective LED elements of Example 1, Example 2, and Reference example has a higher film thickness than the InGaN layer provided in the MQW of the LED element of Conventional example. As the film thickness of the InGaN layer increases in this manner, a two-dimensional electron gas layer is more likely to arise between the third semiconductor layer 3 (InGaN) and the fourth semiconductor layer 4 (AlGaN). As described above, the two-dimensional electron gas layer has the function of spreading the current in the horizontal direction, and in association with this, the current is less likely to concentrate in a narrow region, and the electric field is relaxed. As a result of this, even when high voltage is applied instantaneously, the electric field is less likely to concentrate as a result of diffusion of the electric field in the heterostructure 2, and thus destruction of the element is less likely to occur.

The improvement in the yield in the LED elements of Example 1 and Example 2 compared with the LED element of Reference example would be ascribable to the fact that diffusion of a p-type impurity with which the fifth semiconductor layer 19 (p-type semiconductor layer) is doped into the third semiconductor layer 3 is suppressed due to decrease in the diameter of the V-shaped defect formed in the third semiconductor layer 3 (InGaN) caused by lattice mismatch.

In the above embodiments, the description was made for the case where the heterostructure 2 is formed directly on top of the second semiconductor layer 5. However, in the semiconductor light emitting element 1, also when the heterostructure 2 is formed on the upper face of the second semiconductor layer 5 with a nitride semiconductor layer having a very small film thickness interposed therebetween, the function as with the above can be realized. The present invention is not intended to exclude such a configuration.

[Method for Producing LED Element 1]

Next, one exemplary method for producing the LED element 1 of the present invention will be described. The production conditions and the dimensions such as a film thickness described in the following production method are merely examples, and the present invention is not limited to these numerical values. The exemplary production method shown below concerns the LED element shown in FIG. 2.

<Step S1>

First, on top of the growth substrate 11, the undoped layer 13 is formed. For example, this is achieved by the following steps.

(Preparation of Growth Substrate 11)

When the sapphire substrate is used as the growth substrate 11, cleaning of the c-plane sapphire substrate is conducted. More specifically, this cleaning is conducted by placing the c-plane sapphire substrate in a processing furnace of, for example, MOCVD (Metal Organic Chemical Vapor Deposition) apparatus, and elevating the temperature within the temperature to, for example, 1150° C. while a hydrogen gas is flown at a flow rate of 10 slm in the processing furnace.

(Formation of Undoped Layer 13)

Next, on the surface of the growth substrate 11 (c-plane sapphire substrate), the low temperature buffer layer formed of GaN is formed, and the underlayer formed of GaN is formed on top of the low temperature buffer layer. These low temperature buffer layer and underlayer correspond to the undoped layer 13.

A more specific method for producing the undoped layer 13 is as follows. First, the pressure within the furnace of the MOCVD apparatus is set to be 100 kPa, and the temperature within the furnace is set to be 480° C. Then while a nitrogen gas and a hydrogen gas each at a flow rate of 5 slm are flown as carrier gases in the processing furnace, trimethylgallium (TMG) at a flow rate of 50 µmol/min, and ammonia at a flow rate of 250000 µmol/min are fed as source gases into the processing furnace for 68 seconds. By this process, on the surface of the growth substrate 11, a low temperature buffer layer formed of GaN having a thickness of 20 nm is formed.

Next, the temperature within the furnace of the MOCVD apparatus is elevated to 1150° C. Then, while a nitrogen gas at a flow rate of 20 slm and a hydrogen gas at a flow rate of 15 slm are flown as carrier gases in the processing furnace, TMG at a flow rate of 100 µmol/min, and ammonia at a flow rate of 250000 µmol/min are fed as source gases into the processing furnace for 30 minutes. By this process, on the surface of the low temperature buffer layer, an underlayer formed of GaN having a thickness of 1.7 µm is formed.

<Step S2>

Next, on top of the undoped layer 13, the first semiconductor layer 15 formed of an n-type nitride semiconductor is formed.

A more specific method for forming the first semiconductor layer 15 is, for example, as follows. The pressure within the furnace of the MOCVD apparatus is set to be 30 kPa. Then, while a nitrogen gas at a flow rate of 20 slm and a hydrogen gas at a flow rate of 15 slm are flown as carrier gases in the processing furnace, TMG at a flow rate of 94 µmol/min, trimethylaluminum (TMA) at a flow rate of 6 µmol/min, ammonia at a flow rate of 250000 µmol/min, and tetraethylsilane at a flow rate of 0.025 µmol/min are fed as source gases into the processing furnace for 30 minutes. By this process, on top of the undoped layer 13, a high concentration electron supply layer having a composition of $Al_{0.06}Ga_{0.04}N$, and a Si concentration of $3 \times 10^{19}/cm^3$ and a thickness of 1.7 µm is formed. In other words, at least in the region of the upper face, the first semiconductor layer 15 formed of n-AlGaN having a high concentration electron supply layer having a Si concentration of $3 \times 10^{19}/cm^3$ and a thickness of 1.7 µm is formed by this step.

While the case of using Si as the n-type impurity contained in the first semiconductor layer 15 was described, Ge, S, Se, Sn, Te or the like may be used. Among these, Si is particularly preferred.

<Step S3>

Next, on top of the first semiconductor layer 15, the second semiconductor layer 5 formed of quaternary mixed crystals of $Al_{x1}Ga_{y1}In_{z1}N$ (0<x1<1, 0<y1<1, 0<z1<1, x1+y1+z1=1) is formed. A more specific method for forming the second semiconductor layer 5 is, for example, as follows.

The pressure within the furnace of the MOCVD apparatus is set to be 100 kPa, and the temperature within the furnace is set to be 830° C. Then, the step of feeding TMG at a flow rate of 10 µmol/min, TMA at a flow rate of 1.6 µmol/min, trimethylindium (TMI) at a flow rate of 12 µmol/min and ammonia at a flow rate of 300000 µmol/min as source gases into the processing furnace for 480 seconds while flowing a nitrogen gas at a flow rate of 15 slm and a hydrogen gas at a flow rate of 1 slm as carrier gases in the processing furnace is conducted. By this process, the second semiconductor layer 5 formed of $Al_{0.06}Ga_{0.02}In_{0.02}N$ having a film thickness of 20 nm is formed.

The second semiconductor layer 5 preferably has a film thickness of greater than or equal to 5 nm and less than 500 nm, more preferably has a film thickness of greater than or equal to 5 nm and less than 200 nm, and further preferably has a film thickness of greater than or equal to 5 nm and less than 100 nm.

<Step S4>

Next, on top of the second semiconductor layer 5, the heterostructure 2 constituted of a laminate structure of the third semiconductor layer 3 formed of $In_{x2}Ga_{1-x2}N$ (0<x2<1), and the fourth semiconductor layer 4 formed of $Al_{x3}Ga_{y3}In_{z3}N$ (0<x3<1, 0<y3<1, 0≤z3<1, x3+y3+z3=1) is formed.

A more specific method for forming the heterostructure 2 is, for example, as follows. A step of feeding TMG at a flow rate of 10 μmol/min, TMI at a flow rate of 12 μmol/min, and ammonia at a flow rate of 300000 μmol/min as source gases into the processing furnace for 360 seconds while maintaining the pressure and the temperature within the furnace of the MOCVD apparatus employed in step S3, and flowing a nitrogen gas at a flow rate of 15 slm and a hydrogen gas at a flow rate of 1 slm as carrier gases in the processing furnace is conducted. Thereafter, a step of feeding TMG at a flow rate of 10 μmol/min, TMA at a flow rate of 1.6 μmol/min, tetraethylsilane at a flow rate of 0.009 μmol/min and ammonia at a flow rate of 300000 μmol/min into the processing furnace for 360 seconds is conducted. By this process, the heterostructure 2 constituted of a laminate structure of the fourth semiconductor layer 4 formed of $In_{0.02}Ga_{0.98}N$ having a film thickness of 15 nm, and the third semiconductor layer 3 formed of n-$Al_{0.06}Ga_{0.94}N$ having a film thickness of 20 nm is formed.

A configuration having multiple periods of the heterostructure 2 as shown in FIG. 3 can be realized by repeating the step S4 multiple times.

The third semiconductor layer 3 formed of AlGaInN as in the aforementioned LED element of Example 2 can be realized by adding TMI as a source gas in forming the third semiconductor layer 3.

<Step S5>

Next, on top of the heterostructure 2 (the heterostructure 2 situated at the uppermost layer when having multiple periods of the heterostructure 2), the fifth semiconductor layer 19 formed of p-AlGaN is formed, and on top of the fifth semiconductor layer 19, the p-type contact layer 21 doped with a p-type impurity at high concentration is formed.

A more specific method for forming the fifth semiconductor layer 19 and the p-type contact layer 21 is, for example, as follows. First, the pressure within the furnace of the MOCVD apparatus is maintained at 100 kPa, and the temperature within the furnace is elevated to 1050° C. while a nitrogen gas at a flow rate of 15 slm and a hydrogen gas at a flow rate of 25 slm are flown as carrier gases in the processing furnace. Then as source gases, TMG at a flow rate of 35 μmol/min, TMA at a flow rate of 20 μmol/min, ammonia at a flow rate of 250000 μmol/min, and bis(cyclopentadienyl)magnesium ($Cp_2Mg$) at a flow rate of 0.1 μmol/min are fed in the processing furnace for 60 seconds. By this process, on the surface of the uppermost layer of the heterostructure 2, a hole supply layer having a thickness of 20 nm and a composition of $Al_{0.3}Ga_{0.7}N$ is formed. Thereafter, by feeding the source gases for 360 seconds while the flow rate of TMA is changed to 9 μmol/min, a hole supply layer having a thickness of 120 nm and a composition of $Al_{0.07}Ga_{0.93}N$ is formed. These hole supply layers form the fifth semiconductor layer 19.

Thereafter, the source gases are fed for 20 seconds while feeding of TMA is stopped, and the flow rate of $Cp_2Mg$ is changed to 0.2 μmol/min. By this process, the p-type contact layer 21 formed of p-GaN having a thickness of 5 nm is formed.

While the case of using Mg as a p-type impurity contained in the fifth semiconductor layer 19 and the p-type contact layer 21 is described herein, Be, Zn, C and the like can also be used.

<Step S6>

Next, an activation process is carried out on the wafer obtained through the steps S1 to S5. More specifically, an activation process of 15 minutes at 650° C. in a nitrogen atmosphere is carried out using an RTA (Rapid Thermal Anneal: rapid heating) apparatus.

Subsequently, in the case of realizing a vertically-structured LED element, an electrode formed of a predetermined material (p-side electrode) is formed on the upper face of the p-type contact layer 21, and after peeling off the growth substrate 11, an electrode is formed in the site where the growth substrate 11 was present to form an n-side electrode. In the case of realizing a horizontally-structured LED element, etching is conducted from the p-side until the first semiconductor layer 15 is exposed, and on the upper face of the exposed first semiconductor layer 15, an n-side electrode is formed, and a p-side electrode is formed on the upper face of the p-type contact layer 21. In this case, an electrode such as a transparent electrode may be formed as necessary. Thereafter, each electrode is formed with a power feeding terminal or the like, and the exposed lateral faces and upper face of the element are covered with an insulating layer having high translucency, and connection with the substrate is conducted by wire bonding or the like.

Other Embodiment

In the aforementioned embodiment, the description was made for the case where the heterostructure 2 is formed directly on the second semiconductor layer 5. However, a nitride semiconductor layer constituted of a thin film having a film thickness of about several nanometers may be formed between the second semiconductor layer 5 and the heterostructure 2. Even when such a nitride semiconductor layer is interposed between the second semiconductor layer 5 and the heterostructure 2, the effect of suppressing the internal field in the heterostructure 2 is realized by having the second semiconductor layer 5.

DESCRIPTION OF REFERENCE SIGNS

1: LED element
2: heterostructure
2A: multilayer structure part
3: third semiconductor layer
4: fourth semiconductor layer
5: second semiconductor layer
11: growth substrate
13: undoped layer
15: first semiconductor layer
19: fifth semiconductor layer
21: p-type contact layer
30: conduction band
31: valance band 32: Fermi level of InGaN
33: Fermi level of AlGaN
41: band bending region in the boundary between AlGaN and InGaN
42: substantially flat band region of InGaN
90: conventional LED element
91: growth substrate
92: undoped layer
93: n-type cladding layer
94: active layer made up of MQW
95: p-type cladding layer
96: p-type contact layer
99: tensile stress
101: conduction band
102: valance band

The invention claimed is:

1. A light emitting element comprising:
a first semiconductor layer formed of an n-type nitride semiconductor;
a second semiconductor layer formed on top of the first semiconductor layer, and formed of quaternary mixed crystals of $Al_{x1}Ga_{y1}In_{z1}N$ ($0<x1<1$, $0<y1<1$, $0<z1<1$, $x1+y1+z1=1$);
a heterostructure formed on top of the second semiconductor layer, and constituted of a laminate structure of a third semiconductor layer formed of $In_{x2}Ga_{1-x2}N$ ($0<x2<1$) having a film thickness of greater than or equal to 10 nm, and a fourth semiconductor layer formed of $Al_{x3}Ga_{y3}In_{z3}N$ ($0<x3<1$, $0<y3<1$, $0\le z3\le 0.05$, $x3+y3+z3=1$); and
a fifth semiconductor layer formed on top of the heterostructure and formed of a p-type nitride semiconductor, wherein
the peak emission wavelength is greater than or equal to 362 nm and less than or equal to 395 nm, and
the first semiconductor layer, the second semiconductor layer, the heterostructure, and the fifth semiconductor layer are laminated in the c-axis direction.

2. The light emitting element according to claim 1, wherein a film thickness of the third semiconductor layer is less than or equal to 25 nm.

3. The light emitting element according to claim 1, wherein the heterostructure is made up of repeated multiple periods of the third semiconductor layer and the fourth semiconductor layer.

4. The light emitting element according to claim 1, wherein the fourth semiconductor layer is formed of $Al_{x3}Ga_{1-x3}N$ ($0<x3<1$).

5. The light emitting element according to claim 1, wherein the fourth semiconductor layer is formed of quaternary mixed crystals of $Al_{x3}Ga_{y3}In_{z3}N$ ($0<x3<1$, $0<y3<1$, $0\le z3\le 0.05$, $x3+y3+z3=1$).

6. The light emitting element according to claim 1, wherein a film thickness of the second semiconductor layer is greater than or equal to 10 nm and less than or equal to a critical film thickness.

7. The light emitting element according to claim 2, wherein the heterostructure is made up of repeated multiple periods of the third semiconductor layer and the fourth semiconductor layer.

8. The light emitting element according to claim 2, wherein the fourth semiconductor layer is formed of $Al_{x3}Ga_{1-x3}N$ ($0<x3<1$).

9. The light emitting element according to claim 3, wherein the fourth semiconductor layer is formed of $Al_{x3}Ga_{1-x3}N$ ($0<x3<1$).

10. The light emitting element according to claim 7, wherein the fourth semiconductor layer is formed of $Al_{x3}Ga_{1-x3}N$ ($0<x3<1$).

11. The light emitting element according to claim 2, wherein the fourth semiconductor layer is formed of quaternary mixed crystals of $Al_{x3}Ga_{y3}In_{z3}N$ ($0<x3<1$, $0<y3<1$, $0\le z3\le 0.05$, $x3+y3+z3=1$).

12. The light emitting element according to claim 3, wherein the fourth semiconductor layer is formed of quaternary mixed crystals of $Al_{x3}Ga_{y3}In_{z3}N$ ($0<x3<1$, $0<y3<1$, $0\le z3\le 0.05$, $x3+y3+z3=1$).

13. The light emitting element according to claim 7, wherein the fourth semiconductor layer is formed of quaternary mixed crystals of $Al_{x3}Ga_{y3}In_{z3}N$ ($0<x3<1$, $0<y3<1$, $0\le z3\le 0.05$, $x3+y3+z3=1$).

14. The light emitting element according to claim 2, wherein a film thickness of the second semiconductor layer is greater than or equal to 10 nm and less than or equal to a critical film thickness.

15. The light emitting element according to claim 3, wherein a film thickness of the second semiconductor layer is greater than or equal to 10 nm and less than or equal to a critical film thickness.

16. The light emitting element according to claim 4, wherein a film thickness of the second semiconductor layer is greater than or equal to 10 nm and less than or equal to a critical film thickness.

17. The light emitting element according to claim 5, wherein a film thickness of the second semiconductor layer is greater than or equal to 10 nm and less than or equal to a critical film thickness.

18. The light emitting element according to claim 7, wherein a film thickness of the second semiconductor layer is greater than or equal to 10 nm and less than or equal to a critical film thickness.

19. The light emitting element according to claim 8, wherein a film thickness of the second semiconductor layer is greater than or equal to 10 nm and less than or equal to a critical film thickness.

* * * * *